United States Patent
Hsieh (10) Patent No.: US 11,451,196 B1
(45) Date of Patent: Sep. 20, 2022

(54) DYNAMIC COMPARATOR AND CIRCUIT SYSTEM USING THE SAME

(71) Applicant: NUVOTON TECHNOLOGY CORPORATION, Hsinchu (TW)

(72) Inventor: Chung Ming Hsieh, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/522,315

(22) Filed: Nov. 9, 2021

(30) Foreign Application Priority Data

Jul. 26, 2021 (TW) ................................. 110127295

(51) Int. Cl.
*H03F 3/00* (2006.01)
*H03F 3/45* (2006.01)
*H03M 1/36* (2006.01)
*H03M 1/44* (2006.01)

(52) U.S. Cl.
CPC ......... *H03F 3/005* (2013.01); *H03F 3/45071* (2013.01); *H03M 1/36* (2013.01); *H03M 1/442* (2013.01)

(58) Field of Classification Search
CPC ...... H03F 3/005; H03F 3/45071; H03M 1/36; H03M 1/361–368; H03M 1/442
See application file for complete search history.

(56) References Cited

U.S. PATENT DOCUMENTS

| | | | | |
|---|---|---|---|---|
| 8,736,310 | B2* | 5/2014 | Cheong | H03F 3/45744 327/63 |
| 9,490,832 | B1* | 11/2016 | Zhou | H03K 3/35613 |
| 2010/0164770 | A1* | 7/2010 | Wan | H03M 1/0607 330/251 |
| 2018/0159549 | A1* | 6/2018 | Martens | H03H 19/004 |
| 2020/0007085 | A1* | 1/2020 | Hsieh | H03F 3/005 |

* cited by examiner

*Primary Examiner* — Patrick C Chen
(74) *Attorney, Agent, or Firm* — Muncy, Geissler, Olds & Lowe, P.C.

(57) ABSTRACT

A dynamic comparator includes a differential amplifier stage, a switching unit and a switching charge storage unit. The switching charge storage unit includes a plurality of switching transistors, and a charge storage capacitor electrically connected to the plurality of switching transistors. When an operational mode of the dynamic comparator is switched from a comparison state to a reset state, a voltage on one of a first terminal and a second terminal of the charge storage capacitor is increased from a half of the system voltage to a system voltage, so as to implement a charge recycle effect. The dynamic comparator of the present invention can have lower power consumption and lower charge-discharge current.

17 Claims, 7 Drawing Sheets

DYNAMIC COMPARATOR AND CIRCUIT SYSTEM USING THE SAME

BACKGROUND

1. Technical Field

The present disclosure is related to a dynamic comparator, and more particularly to a dynamic comparator capable of performing a charge recycling effect on the charge storage capacitor. The present disclosure is also related to a circuit system using the above-mentioned dynamic comparator.

2. Description of the Related Art

Different from general amplifiers, a dynamic amplifier is controlled by a clock signal and an inverse clock signal, and can be operated in a reset state and a comparison state at different times. The dynamic amplifier has the advantages of high-speed operation and low power consumption, and can be used in an analog-to-digital converter (ADC) or other circuits, especially in various types of biomedical electronic equipment and successive-approximation register ADC.

Figure 1:
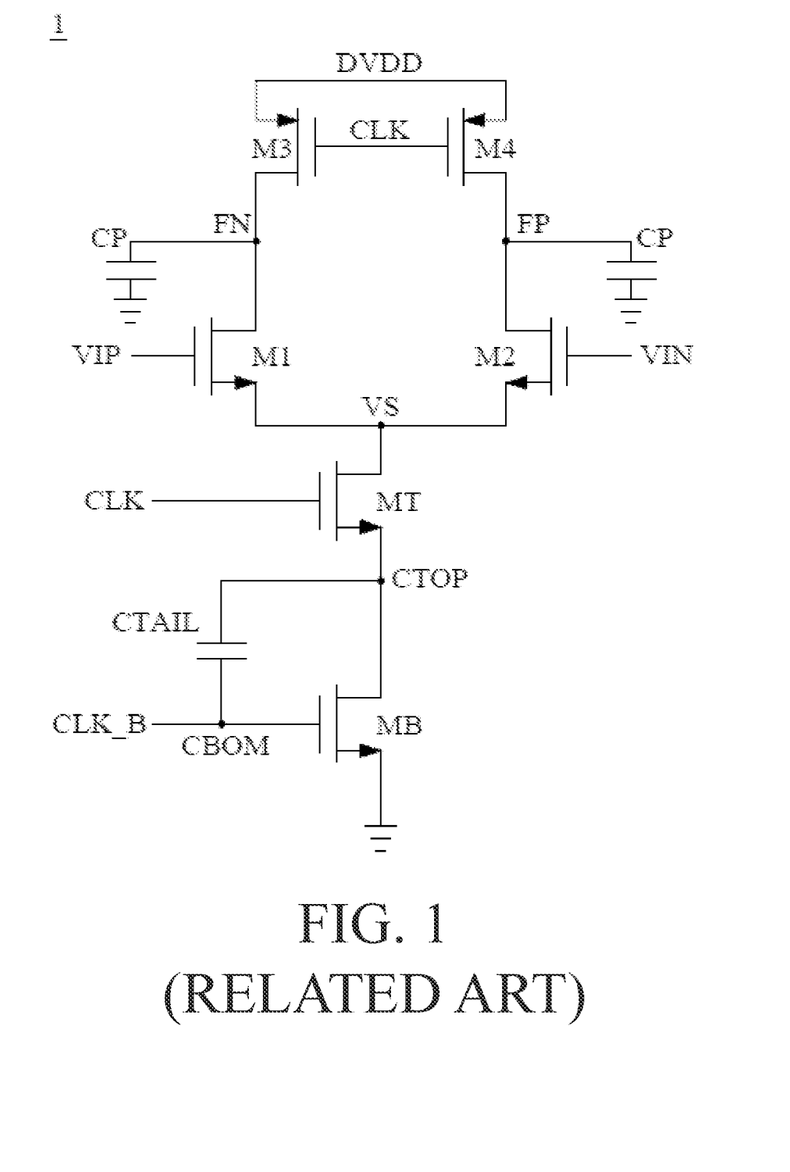
FIG. 1 is a circuit diagram of a conventional dynamic amplifier.

Please refer to FIG. 1, which is a circuit diagram of a conventional dynamic amplifier. The dynamic amplifier 1 includes a plurality of transistors M1~M4, MT, MB, a plurality of capacitor CP and a charge storage capacitor CTAIL, and a latch unit (not shown in FIG. 1). The latch unit is electrically connected to nodes FN and FP and configured to output a comparison result and an inverse comparison result of the dynamic comparison 1. The transistors M1 and M2 are used as a differential amplifier stage, and gates of the transistors M1 and M2 receive a first input signal VIP and a second input signal VIN, respectively. The difference between the first input signal VIP and the second input signal VIN determines the voltages on the node FN and FP.

In a reset state, the inverse clock signal CLK_B is at a logic-high level, and the clock signal CLK is at a logic-low level, the transistor MT is turned off, and the transistors M3, M4 and MB are turned on. Therefore, the charge storage capacitor CTAIL is charged by the inverse clock signal CLK_B, so that the voltage on the node CBOM is increased to a system voltage DVDD, and the voltage on the node CTOP is ground voltage, that is, the voltage difference between the second terminal and the first terminal (that is, the nodes CBOM and CTOP) of the charge storage capacitor CTAIL is the system voltage DVDD.

In a comparison state, the clock signal CLK is at the logic-high level, the inverse clock signal CLK_B is at the logic-low level, the transistor MT is turned on, the transistors M3, M4 and MB are turned off. The inverse clock signal CLK_B is at the logic-low level, and at the moment when the charge is not redistributed, the voltage difference between two terminals of the charge storage capacitor CTAIL must be maintained as the system voltage DVDD, so in the comparison state, the voltage at the node CBOM is the ground voltage, and the voltage at the node CTOP is negative system voltage DVDD (that is, −DVDD). Because the transistor MT is turned on, the voltage at the node VS is substantially equal to the voltage at the node CTOP. The charges of the capacitor CP flow to the node VS, so that the voltages at the node VS and the node CTOP are charged from −DVDD to DVDD/2. Therefore, the voltage difference between the first terminal and the second terminal (that is, the nodes CTOP and CBOM) of the charge storage capacitor CTAIL is a half of the system voltage DVDD, that is, DVDD/2.

The charge storage capacitor CTAIL is pre-charged to the system voltage DVDD in the reset state, when the charge storage capacitor CTAIL is switched to the reset state from the comparison state, the voltage at the first terminal (that is, the node CTOP) of the charge storage capacitor CTAIL is pulled down to the ground voltage from the DVDD/2, so the charges (CTAIL*DVDD/2) stored in the charge storage capacitor CTAIL is wasted and not recycled, and it leads to waste of power and larger charge-discharge current.

SUMMARY

In order to achieve an objective of the present disclosure, the present disclosure provides a dynamic comparator including a differential amplifier stage, a switching unit, and a switching charge storage unit. The switching charge storage unit includes a plurality of switching transistors, and a charge storage capacitor electrically connected to the plurality of switching transistors. When the dynamic comparator is switched from a comparison state to a reset state, the voltage on one of a first terminal and a second terminal of the charge storage capacitor is increased from a half of the system voltage to the system voltage, so as to implement the charge recycle effect.

Particularly, the reset state includes a first reset state and a second reset state, and the comparison state includes a first comparison state and a second comparison state. When the dynamic comparator is switched from the first comparison state to the second reset state, the voltage on the second terminal of the charge storage capacitor is increased from a half of the system voltage to the system voltage; when the dynamic comparator is switched from the second comparison state to the first reset state, the voltage on the first terminal of the charge storage capacitor is increased from a half of the system voltage to the system voltage.

In order to achieve an objective of the present disclosure, the present disclosure further provides a circuit system including a plurality of circuits, the plurality of circuits include a dynamic comparator, and the dynamic comparator is electrically connected to at least one of circuits other than the dynamic comparator.

According to the above-mentioned contents, the present disclosure provides a dynamic comparator, a circuit system using the above-mentioned dynamic comparator, and when the dynamic comparator is switched to the comparison state from the reset state, the charge of the charge storage capacitor can be recycled.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE EXEMPLARY EMBODIMENTS

The following embodiments of the present disclosure are herein described in detail with reference to the accompanying drawings. These drawings show specific examples of the embodiments of the present disclosure. These embodiments are provided so that this disclosure will be thorough and complete, and will fully convey the scope of the disclosure to those skilled in the art. It is to be acknowledged that these embodiments are exemplary implementations and are not to be construed as limiting the scope of the present disclosure in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

The present disclosure provides a dynamic comparator capable of performing recycling on charges of a charge storage capacitor, so as to prevent from charge loss when the dynamic comparator is changed to the reset state from the comparison state, and also prevent from unnecessary power consumption and increasing of lower charge-discharge current. Furthermore, the present disclosure further provides a circuit system including a plurality of circuits, the plurality of circuits include a dynamic comparator, and the dynamic comparator is electrically connected to at least one of circuits other than the dynamic comparator. For example, the circuit system can be biomedical electronic equipment or a successive-approximation register ADC, but the type of the circuit system and the application of the dynamic comparator of the present disclosure is not limited thereto.

Figure 2:
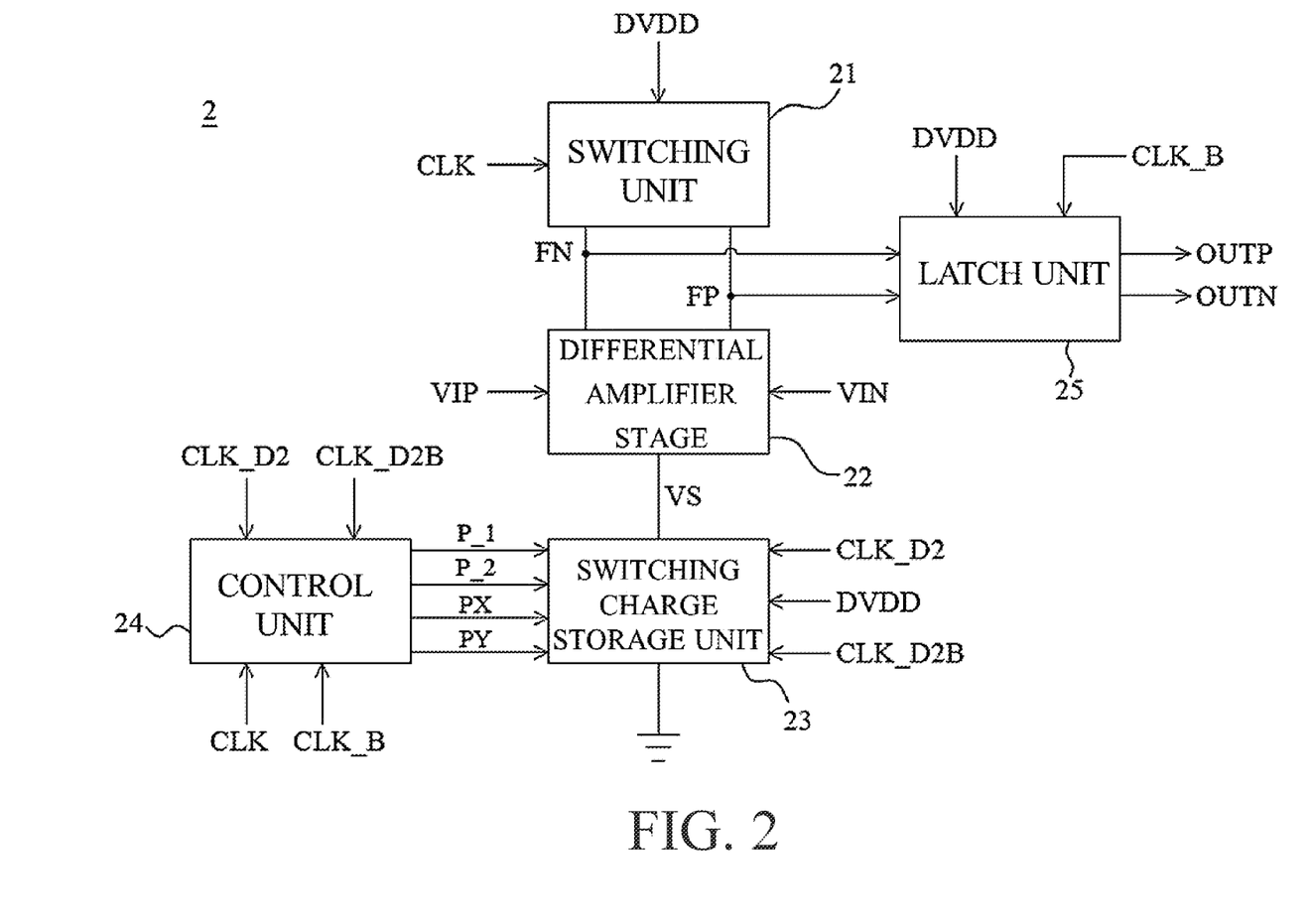
FIG. 2 is a functional block diagram of a dynamic comparator, according to an embodiment of the present disclosure.
Figure 3:
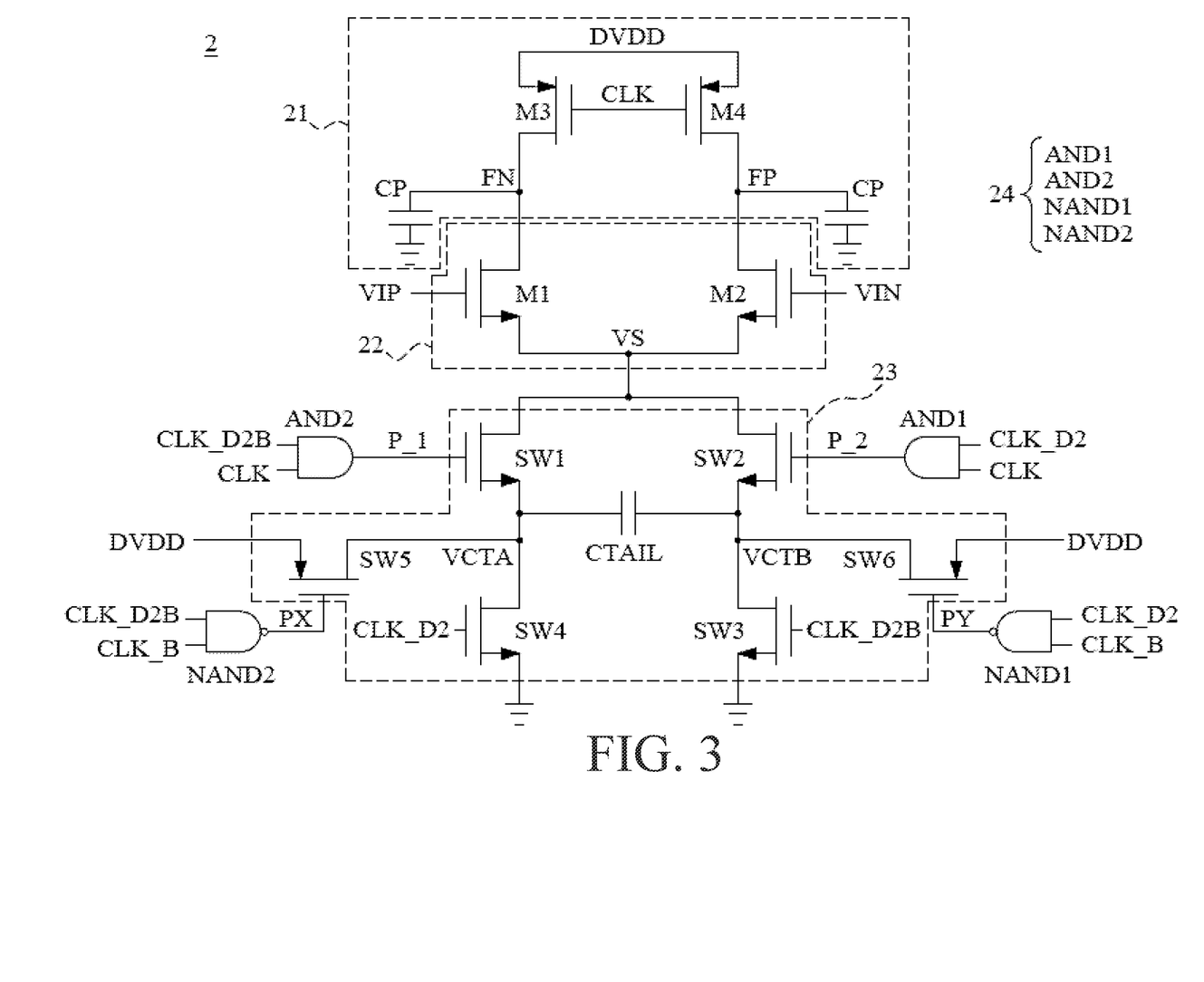
FIG. 3 is a circuit diagram of a part of a dynamic comparator, according to an embodiment of the present disclosure.

Please refer to FIGS. 2 and 3. FIG. 2 is a functional block diagram of a dynamic comparator and FIG. 3 is a circuit diagram of a part of a dynamic comparator, according to an embodiment of the present disclosure. The dynamic comparator 2 has nodes FN, FP and VS formed therein, and includes a switching unit 21, a differential amplifier stage 22, a switching charge storage unit 23, a control unit 24 and a latch unit 25. The switching unit 21 is electrically connected to the differential amplifier stage 22 and the latch unit 25 via the nodes FP and FN. The switching charge storage unit 23 is electrically connected to the differential amplifier stage 22 via the node VS, and the control unit 24 is electrically connected to switching charge storage unit 23. The dynamic comparator 2 can be operated in one of a first comparison state, a second comparison state, a first reset state and a second reset state.

The switching unit 21 receives a system voltage DVDD and a clock signal CLK. In the first reset state and the second reset state, the clock signal CLK is at a logic-low level, the switching unit 21 provides the system voltage DVDD to the nodes FP and FN. The differential amplifier stage 22 receives the input signals VIP and VIN. In the first comparison state and the second comparison state, the clock signal CLK is at a logic-high level, the differential amplifier stage 22 outputs a comparison result and an inverse comparison result of the input signals VIP and VIN to the nodes FP and FN, respectively.

The switching charge storage unit 23 receives switching control signals P_1, P_2, PX and PY, the clock signal CLK_D2, and the inverse clock signal CLK_D2B, and the system voltage DVDD, and the switching charge storage unit 23 includes a plurality of switching transistors SW1~SW6, and a charge storage capacitor CTAIL electrically connected to the plurality of switching transistors SW1~SW6. The switching transistors SW1~SW6 are controlled by the switching control signals P_1, P_2, PX and PY, the clock signal CLK_D2 and the inverse clock signal CLK_D2B. When the operational state of the dynamic comparator 2 is switched to the second reset state from the first comparison state, the voltage on the second terminal VCTB of the charge storage capacitor CTAIL is increased from DVDD/2 to DVDD, the voltage of the first terminal VCTA of the charge storage capacitor CTAIL is maintained at the low voltage, such as ground voltage, but the present disclosure is not limited thereto. When the operational state of the dynamic comparator 2 is switched from the second comparison state to the first reset state, the voltage on the first terminal VCTA of the charge storage capacitor CTAIL is increased from DVDD/2 to DVDD, the voltage of the second terminal VCTB of the charge storage capacitor CTAIL is maintained at the low voltage, such as the ground voltage, but the present disclosure is not limited thereto.

The control unit 24 receives the clock signals CLK and CLK_D2, and the inverse clock signals CLK_B and CLK_D2B, and generates the control signal P_1, P_2, PX and PY to control the dynamic comparator 2 to operate in one of the first reset state, the second reset state, the first comparison state and the second comparison state. The period of the clock signal CLK_D2 is two times of the period of the clock signal CLK, the inverse clock signal CLK_B is inverse to the clock signal CLK, the inverse clock signal CLK_D2B is inverse to the clock signal CLK_D2. It should be noted that, in some embodiments, the control unit 24 is not a necessary component, and the switching charge storage unit is able to self-switch between the first reset state, the second reset state, the first comparison state and the second comparison state. Furthermore, the inverse clock signals CLK_D2B, CLK_B and CLK_D2 are inputted from outsides of the control unit 24 in this embodiment, but in other embodiment, the inverse clock signals CLK_D2B, CLK_B and CLK_D2 can be generated by the control unit 24 based on the clock signal CLK.

The latch unit 25 is configured to receive the system voltage DVDD and the inverse clock signal CLK_B, and latch the comparison result and the inverse comparison result on the nodes FN and FP. In the first comparison state and the second comparison state, the latch unit 25 outputs the inverse comparison result and the comparison result to the output terminals OUTN and OUTP, respectively. It should be noted that the latch unit 25 can be one of various known latch components, so the detailed description is not repeated herein. Furthermore, the latch unit 25 in FIG. 2 is not a necessary component, so the latch unit 25 is not illustrated in FIG. 3.

An embodiment of the switching unit 21 will be described in the following paragraphs, but the concept of the present disclosure is not limited thereto. The switching unit includes a PMOS transistors M3, M4 and two capacitors CP. The two terminals of the capacitor CP shown on left side of FIG. 3 are electrically connected to the node FN and the low voltage (such as ground voltage, but the present disclosure is not limited thereto), respectively; the two terminals of the capacitor CP shown on right side of FIG. 3 are electrically connected to the node FP and the low voltage (such as ground voltage, but the present disclosure is not limited thereto), respectively. Two gates of the PMOS transistors M3 and M4 receive the clock signal CLK, two sources of the PMOS transistors M3 and M4 receive the system voltage DVDD, and two drains of the PMOS transistors M3 and M4 are electrically connected to the nodes FN and FP, respectively.

An embodiment of the differential amplifier stage 22 will be described in the following paragraphs, but the concept of the present disclosure is not limited thereto. The differential amplifier stage 22 includes NMOS transistors MN1 and MN2; two gated of the NMOS transistors MN1 and MN2 receive the input signals VIP and VIN, respectively; two sources of the NMOS transistors MN1 and MN2 receive the input signals VIP and VIN, respectively; two sources of the NMOS transistors MN1 and MN2 are electrically connected to the node VS, respectively; two drains of the NMOS transistors MN1 and MN2 are electrically connected to the nodes FN and FP, respectively.

An embodiment of the switching charge storage unit 23 will be described in the following paragraphs, but the concept of the present disclosure is not limited thereto. The switching charge storage unit 23 includes six switching transistors SW1~SW6, each of the switching transistors SW1~SW4 is a NMOS transistor, and each of the switching transistors SW5 and SW6 is a PMOS transistor. Six gates of the first to sixth switching transistor SW1~SW6 receive the switching control signals P_1 and P_2, the clock signal CLK_D2, the inverse clock signal CLK_D2B and the switching control signals PX and PY, respectively. Two drains of the switching transistors SW1 and SW2 are electrically connected to the node VS; two sources of the switching transistors SW1 and SW2 are electrically connected to the first terminal VCTA and the second terminal VCTB of the charge storage capacitor CTAIL, respectively; two drains of the switching transistors SW4 and SW3 are electrically connected to the first terminal VCTA and the second terminal VCTB of the charge storage capacitor CTAIL, respectively; two sources of the switching transistors SW4 and SW3 are electrically connected to the low voltage (such as, ground voltage, but the present disclosure is not limited thereto); two sources of the switching transistors SW5 and SW6 receive the system voltage DVDD; two drains of the switching transistors SW5 and SW6 are electrically connected to the first terminal VCTA and the second terminal VCTB of the charge storage capacitor CTAIL, respectively.

An embodiment of the control unit 24 will be described in the following paragraphs, but the concept of the present disclosure is not limited thereto. The control unit 24 includes AND gates AND1 and AND2, and NAND gates NAND1 and NAND2. The AND gate AND1 receives the clock signals CLK and CLK_D2, and generates the switching control signal P_2. The AND gate AND2 receives the clock signal CLK and the inverse clock signal CLK_D2B, and generates the switching control signal P_1. The NAND gate NAND1 receives the inverse clock signal CLK_B and CLK_D2, and generates the switching control signal PY. The NAND gate NAND2 receives the inverse clock signal CLK_B and CLK_D2B, and generates the switching control signal PX.

Figure 4A:
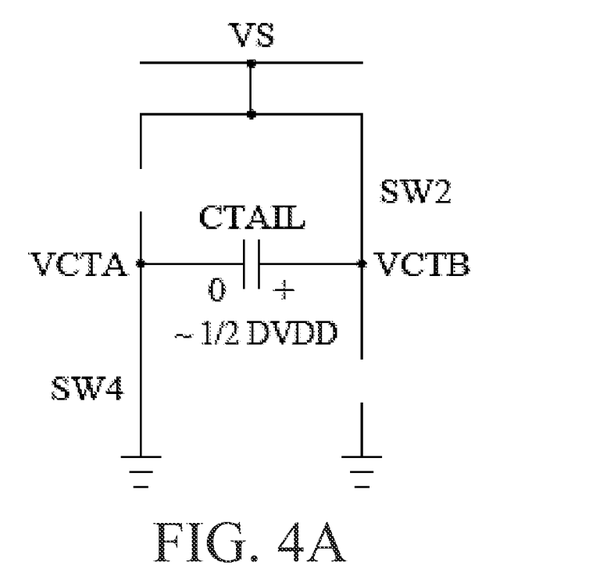
FIGS. 4A to 4D are schematic views of a dynamic comparator charging or discharging the charge storage capacitor in different operational states.
Figure 4B:
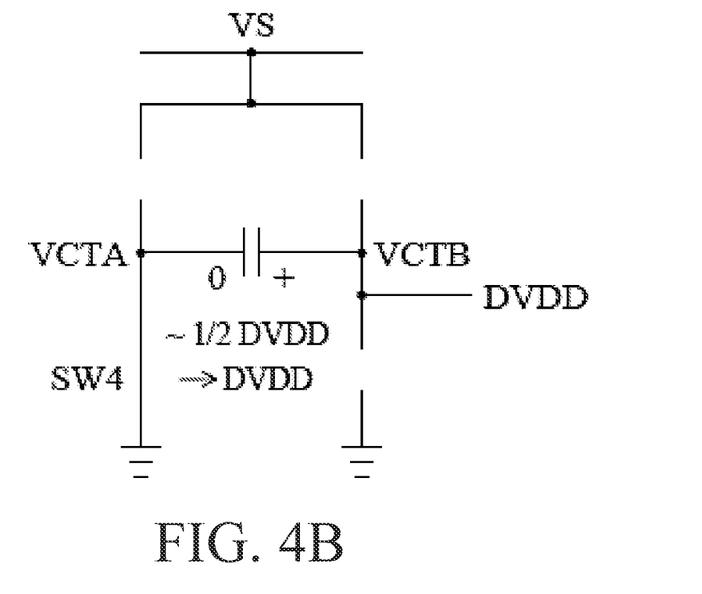
Figure 4C:
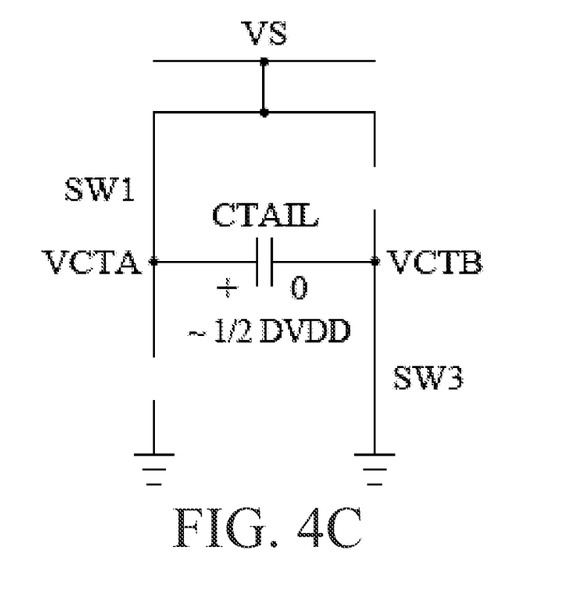
Figure 4D:
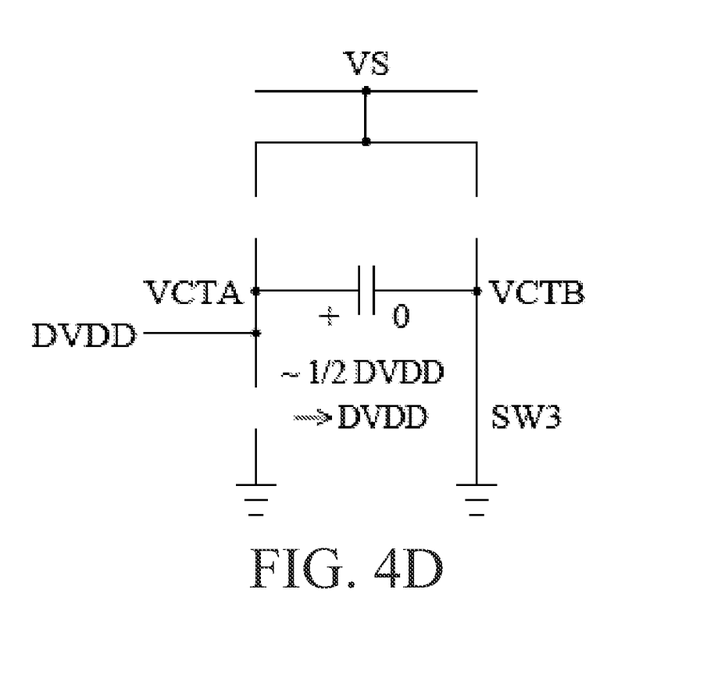
Figure 5:
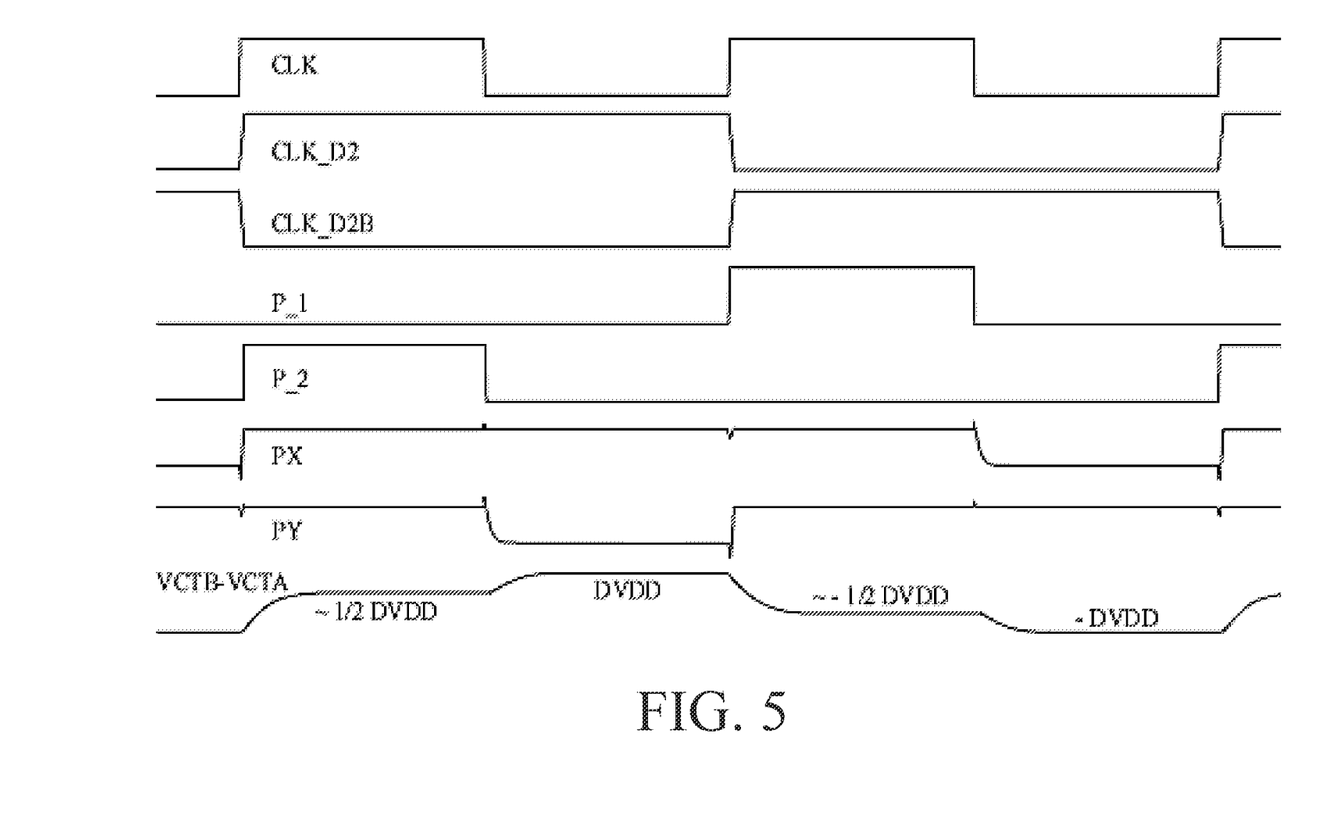
FIG. 5 is a signal waveform diagram of a dynamic comparator, according to an embodiment of the present disclosure.

Please refer to FIGS. 3 to 5. FIGS. 4A to 4D are schematic views of a dynamic comparator charging or discharging a charge storage capacitor in different operational states, and FIG. 5 is a signal waveform diagram of a dynamic comparator, according to an embodiment of the present disclosure. According to the signal waveform diagram shown in FIG. 5, the dynamic comparator 2 is operated in the first comparison state first (or switched to the first comparison state), from the second reset state; each of the clock signals CLK and CLK_D2 is at the logic-high level, the switching control signals P_2, PX, and PY are at the logic-high level. As shown in FIG. 4A, the switching transistors SW2 and SW4 are turned on, the switching transistors SW1, SW3, SW5 and SW6 are turned off. The node VS is electrically connected to the low voltage through the charge storage capacitor CTAIL, the voltage at the second terminal VCTB of the charge storage capacitor CTAIL is charged to DVDD/2 from –DVDD, the voltage at the first terminal VCTA of the charge storage capacitor CTAIL is maintained at the low voltage, and the voltage difference between the second terminal VCTB and the first terminal VCTA of the charge storage capacitor CTAIL is DVDD/2.

Next, the clock signal CLK is changed to the logic-low level from the logic-high level, the dynamic comparator 2 is switched to the first reset state from the first comparison state, the switching control signal PX is at the logic-high level, as shown in FIG. 4B, the switching transistors SW4 and SW6 are turned on, the other switching transistors SW1, SW2, SW3 and SW5 are turned off. The node VS is not connected to the charge storage capacitor CTAIL, the voltage at the second terminal VCTB of the charge storage capacitor CTAIL is charged to the DVDD from DVDD/2, the voltage at the first terminal VCTA of the charge storage capacitor CTAIL is maintained at the low voltage, and the voltage difference between the second terminal VCTB and the first terminal VCTA of the charge storage capacitor CTAIL is DVDD/2. The charge (CTAIL*DVDD/2) of the charge storage capacitor CTAIL is recycled, so as to prevent waste of charge.

Next, the clock signal CLK is changed to be at the logic-high level from the logic-low level, the clock signal CLK_D2 is changed to the logic-low level from the logic-high level, the dynamic comparator 2 is switched to the second comparison state from the first reset state, each of the switching control signal P_1 and PX is at the logic-high level, as shown in FIG. 4C, the switching transistors SW1 and SW3 are turned on, the other switching transistors SW2, SW4, SW5 and SW6 are turned off. The node VS is electrically connected to the low voltage through the charge storage capacitor CTAIL, the voltage at the first terminal VCTA of the charge storage capacitor CTAIL is charged to DVDD/2 from −DVDD, the voltage at the second terminal VCTB of the charge storage capacitor CTAIL is maintained at the low voltage, and the voltage difference between the second terminal VCTB and the first terminal VCTA of the charge storage capacitor CTAIL is −DVDD/2.

Next, the level of the clock signal CLK is changed to the logic-low level from the logic-high level, the dynamic comparator 2 is switched to the second reset state from the second comparison state, the switching control signal PY is at the logic-high level, as shown in FIG. 4D, the switching transistors SW3 and SW5 are turned on, the other switching transistors SW1, SW2, SW4 and SW6 are turned off. The node VS is not connected to the charge storage capacitor CTAIL, the voltage of the first terminal VCTA of the charge storage capacitor CTAIL is charged to DVDD from DVDD/2, the voltage at the second terminal VCTB of the charge storage capacitor CTAIL is maintained at the low voltage, the voltage difference between the second terminal VCTB and the first terminal VCTA of the charge storage capacitor CTAIL is −DVDD, and the charge (CTAIL*DVDD/2) of the charge storage capacitor CTAIL can be recycled to prevent waste of charge.

Figure 6:
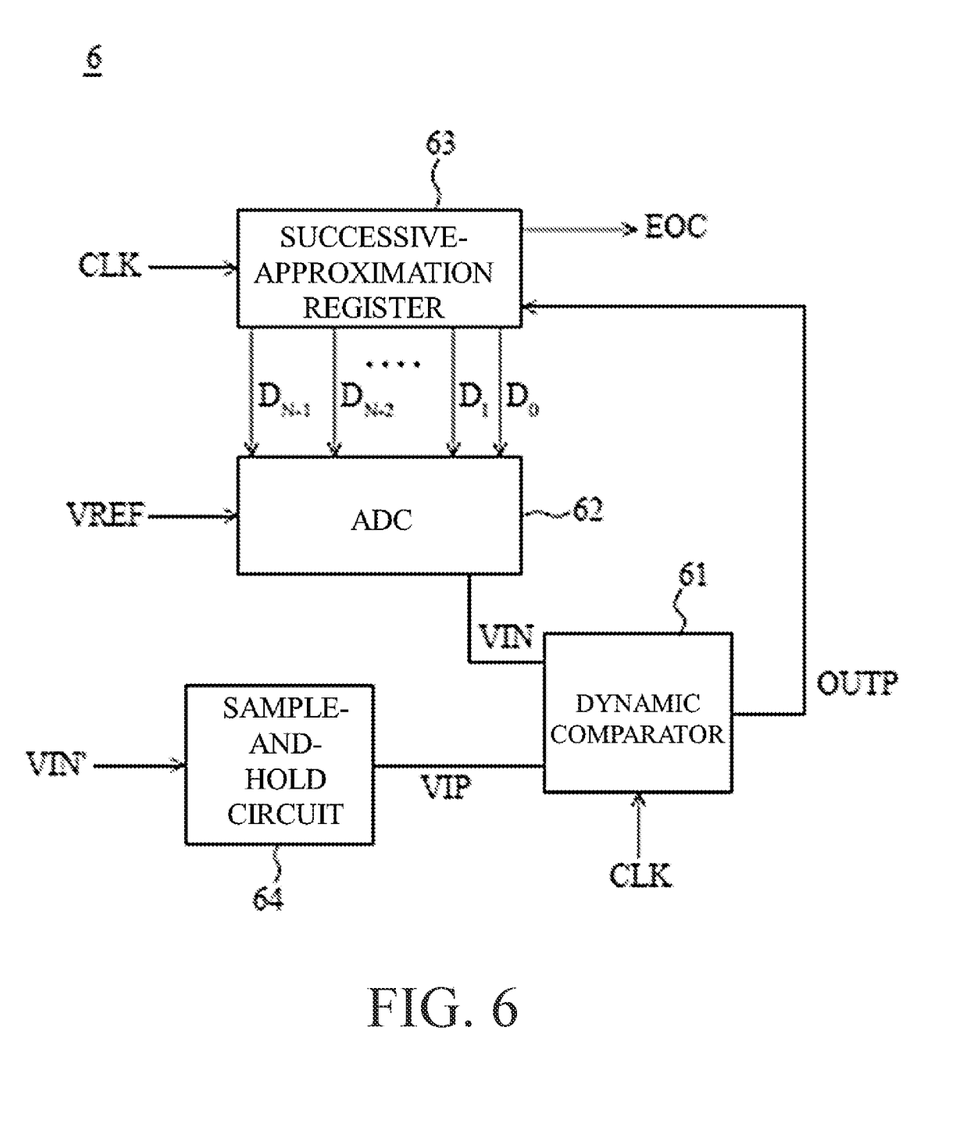
FIG. 6 is a functional block diagram of a circuit system, according to an embodiment of the present disclosure.

Please refer to FIG. 6, which is a functional block diagram of a circuit system, according to an embodiment of the present disclosure. The circuit system 6 includes a plurality of circuits, and in this embodiment, the circuit system 6 is a successive-approximation register ADC, so the plurality of circuits includes a dynamic comparator 61, an analog-to-digital converter 62, a successive-approximation register 63 and a sample-and-hold circuit 64, respectively; the dynamic comparator 61 is the above-mentioned dynamic comparator 2 electrically connected to the analog-to-digital converter 62, the successive-approximation register 63, and the sample-and-hold circuit 64. The analog-to-digital converter 62 is electrically connected to the successive-approximation register 63. The successive-approximation register 63 receives the clock signal CLK, and the comparison results output from the output terminal OUTP of the dynamic comparator 61, and generates a plurality of bits D0~DN−1 to the analog-to-digital converter 62. The analog-to-digital converter 62 receives a reference voltage, and generates an input signal VIN based on the plurality of bits D0~DN−1. The sample-and-hold circuit 64 receives the input signal VIN' to generate the input signal VIN. The dynamic comparator 61 compares the input signals VIP and VIN. After the conversion is completed, the successive-approximation register 63 outputs an end-of-conversion signal EOC.

According to the above-mentioned contents, the dynamic comparator of the embodiment of the present invention can recycle the charge of the charge storage capacitor when being switched to the disclosure state from the reset state; compared with the conventional technology, the dynamic comparator of the present disclosure has lower power consumption and lower charge-discharge current, and more particularly, in a condition of limited power, the circuit system using the above-mentioned dynamic comparator can have loner operation time.

The present disclosure disclosed herein has been described by means of specific embodiments. However, numerous modifications, variations and enhancements can be made thereto by those skilled in the art without departing from the spirit and scope of the present disclosure set forth in the claims.

What is claimed is:

1. A dynamic comparator, having a first node, a second node and a third node formed therein, wherein the dynamic comparator comprises:
    a differential amplifier stage configured to receive a first input signal and a second input signal, and output a comparison result and an inverse comparison result of the first input signal and the second input signal to the second node and the first node, respectively, in a comparison state;
    a switching unit electrically connected to the differential amplifier stage through the first node and the second node, and configured to provide a system voltage to the first node and the second node in a reset state;
    a switching charge storage unit electrically connected to the differential amplifier stage through the third node, and comprising a plurality of switching transistors, and a charge storage capacitor electrically connected to the plurality of switching transistors, wherein when the dynamic comparator is operated in the comparison state, the switching charge storage unit is configured to connect the third node to a low voltage through the charge storage capacitor, and when the dynamic comparator is operated in the reset state, the third node is not electrically connected to the switching charge storage unit, and when the dynamic comparator is switched from the comparison state to the reset state, the voltage on one of a first terminal and a second terminal of the charge storage capacitor is increased from a half of the system voltage to the system voltage.

2. The dynamic comparator according to claim 1, further comprising:
    a control unit electrically connected to the switching charge storage unit and configured to receive a first clock signal, a first inverse clock signal, a second clock signal, and a second inverse clock signal and generate a plurality of control signals to control the dynamic comparator to operate in one of the reset state and the comparison state, wherein a period of the second clock signal is two times of a period of the first clock signal, the first inverse clock signal is inverse to the first clock signal, and the second inverse clock signal is inverse to the second clock signal;
    wherein the switching charge storage unit is configured to receive the system voltage, the plurality of switching control signals, the second clock signal and the second inverse clock signal, and the plurality of switching transistors are controlled by the plurality of switching control signals, the second clock signal and the second inverse clock signal, respectively, and when the dynamic comparator is switched from the comparison state to the reset state, the voltage on one of the first terminal and the second terminal of the charge storage capacitor is increased from a half of the system voltage to the system voltage.

3. The dynamic comparator according to claim 2, wherein the reset state comprises a first reset state and a second reset state, the comparison state comprises a first comparison state and a second comparison state;
    wherein when the dynamic comparator is switched from the first comparison state to the second reset state, the voltage on the second terminal of the charge storage capacitor is increased from a half of the system voltage to the system voltage, and the voltage of the first terminal of the charge storage capacitor is maintained at the low voltage;

wherein when the dynamic comparator is switched from the second comparison state to the first reset state, the voltage on the first terminal of the charge storage capacitor is increased from a half of the system voltage to the system voltage, and the voltage of the second terminal of the charge storage capacitor is maintained at the low voltage.

4. The dynamic comparator according to claim 3, wherein the plurality of switching control signals comprise first to fourth switching control signals, the plurality of switches comprise first to sixth switching transistors, and six gates of the first to sixth switching transistors receive the first switching control signal, the second switching control signal, the second inverse clock signal, the second clock signal, the third switching control signal and the fourth switching control signal, respectively, two drains of the first switching transistor and the second switching transistor are electrically connected to the third node, two sources of the first switching transistor and the second switching transistor are electrically connected to the first terminal and the second terminal of the charge storage capacitor, respectively, two drains of the fourth switching transistor and the third switching transistor are electrically connected to the first terminal and the second terminal of the charge storage capacitor, respectively, two sources of the fourth switching transistor and the third switching transistor are electrically connected to the low voltage, two sources of the fifth switching transistor and the sixth switching transistors receive the system voltage, two drains of the fifth switching transistor and the sixth switching transistor are electrically connected to the first terminal and the second terminal of the charge storage capacitor, respectively.

5. The dynamic comparator according to claim 4, wherein in the first reset state, the third switching transistor and the fifth switching transistor are turned on, and the first, second, fourth and sixth switching transistors are turned off;

wherein in the first comparison state, the second switching transistor and the fourth switching transistor are turned on, and the first, third, fifth and sixth switching transistors are turned off;

wherein in the second reset state, the fourth switching transistor and the sixth switching transistor are turned on, and the first, second, third and fifth switching transistors are turned off;

wherein in the second comparison state, the first switching transistor and the third switching transistor are turned on, and the second, fourth, fifth and sixth switching transistors are turned off.

6. The dynamic comparator according to claim 4, wherein the control unit comprises a first AND gate, a second AND gate, a first NAND gate and a second NAND gate, the first AND gate is configured to receive the first clock signal and the second clock signal and generate the second switching control signal, the second AND gate is configured to receive the first clock signal and the second inverse clock signal and generate the first switching control signal, the first NAND gate is configured to receive the first inverse clock signal and the second clock signal and generate the fourth switching control signal, and the second NAND gate is configured to receive the first inverse clock signal and the second inverse clock signal and generate the third switching control signal.

7. The dynamic comparator according to claim 1, wherein the differential amplifier stage comprises a first transistor and a second transistor, wherein two gates of the first transistor and the second transistor receive the first input signal and the second input signal, respectively, two sources of the first transistor and the second transistor are electrically connected to the third node, and two drains of the first transistor and the second transistor are electrically connected to the second node and the first node, respectively.

8. The dynamic comparator according to claim 1, wherein the switching unit comprises a third transistor, a fourth transistor, a first capacitor and a second capacitor, wherein two ends of the first capacitor are electrically connected to the second node and the low voltage, respectively, two ends of the second capacitor are electrically connected to the first node and the low voltage, respectively, two gates of the third transistor and the fourth transistor receive the first clock signal, two sources of the third transistor and the fourth transistor are electrically receive the system voltage, and two drains of the third transistor and the fourth transistor are electrically connected to the second node and the first node, respectively.

9. A dynamic comparator, comprising a first node, a second node and a third node formed therein, and the dynamic comparator comprises:
a differential amplifier stage configured to receive a first input signal and a second input signal and output a comparison result and an inverse comparison result of the first input signal and the second input signal to the second node and the first node, respectively, in a first comparison state and a second comparison state;
a switching unit electrically connected to the differential amplifier stage through the first node and the second node and configured to receive a system voltage and provide a system voltage to the first node and the second node, in a first reset state and a second reset state;
a control unit configured to control the dynamic comparator to operate in one of the first reset state, the second reset state, the first comparison state and the second comparison state; and
a switching charge storage unit electrically connected to the differential amplifier stage through the third node, and electrically connected to the control unit, and comprising a charge storage capacitor, wherein when the dynamic comparator is switched from the first comparison state to the second reset state, a voltage on a second terminal of the charge storage capacitor is increased from a half of the system voltage to the system voltage, and when the dynamic comparator is switched from the second comparison state to the first reset state, a voltage on a first terminal of the charge storage capacitor is increased from a half of the system voltage to the system voltage.

10. A circuit system comprises a plurality of circuits, wherein the plurality of circuits comprise a dynamic comparator having a first node, a second node and a third node formed therein, the dynamic comparator is electrically connected to at least one of the plurality of circuits other than the dynamic comparator, and the dynamic comparator comprises:
a differential amplifier stage configured to receive a first input signal and a second input signal, and output a comparison result and an inverse comparison result of the first input signal and the second input signal to the second node and the first node, respectively, in a comparison state;
a switching unit electrically connected to the differential amplifier stage through the first node and the second node, and configured to provide a system voltage to the first node and the second node in a reset state;

a switching charge storage unit electrically connected to the differential amplifier stage through the third node, and comprising a plurality of switching transistors, and a charge storage capacitor electrically connected to the plurality of switching transistors, wherein when the dynamic comparator is operated in the comparison state, the switching charge storage unit is configured to connect the third node to a low voltage through the charge storage capacitor, and when the dynamic comparator is operated in the reset state, the third node is not electrically connected to the switching charge storage unit, and when the dynamic comparator is switched from the comparison state to the reset state, the voltage on one of a first terminal and a second terminal of the charge storage capacitor is increased from a half of the system voltage to the system voltage.

11. The circuit system according to claim 10, wherein the dynamic comparator further comprises:

a control unit electrically connected to the switching charge storage unit and configured to receive a first clock signal, a first inverse clock signal, a second clock signal, and a second inverse clock signal and generate a plurality of control signals to control the dynamic comparator to operate in one of the reset state and the comparison state, wherein a period of the second clock signal is two times of a period of the first clock signal, the first inverse clock signal is inverse to the first clock signal, and the second inverse clock signal is inverse to the second clock signal;

wherein the switching charge storage unit is configured to receive the system voltage, the plurality of switching control signals, the second clock signal and the second inverse clock signal, and the plurality of switching transistors are controlled by the plurality of switching control signals, the second clock signal and the second inverse clock signal, respectively, and when the dynamic comparator is switched from the comparison state to the reset state, the voltage on one of the first terminal and the second terminal of the charge storage capacitor is increased from a half of the system voltage to the system voltage.

12. The circuit system according to claim 11, wherein the reset state comprises a first reset state and a second reset state, the comparison state comprises a first comparison state and a second comparison state;

wherein when the dynamic comparator is switched from the first comparison state to the second reset state, the voltage on the second terminal of the charge storage capacitor is increased from a half of the system voltage to the system voltage, and the voltage of the first terminal of the charge storage capacitor is maintained at the low voltage;

wherein when the dynamic comparator is switched from the second comparison state to the first reset state, the voltage on the first terminal of the charge storage capacitor is increased from a half of the system voltage to the system voltage, and the voltage of the second terminal of the charge storage capacitor is maintained at the low voltage.

13. The circuit system according to claim 12, wherein the plurality of switching control signals comprise first to fourth switching control signals, the plurality of switches comprise first to sixth switching transistors, and six gates of the first to sixth switching transistors receive the first switching control signal, the second switching control signal, the second inverse clock signal, the second clock signal, the third switching control signal and the fourth switching control signal, respectively, two drains of the first switching transistor and the second switching transistor are electrically connected to the third node, two sources of the first switching transistor and the second switching transistor are electrically connected to the first terminal and the second terminal of the charge storage capacitor, respectively, two drains of the fourth switching transistor and the third switching transistor are electrically connected to the first terminal and the second terminal of the charge storage capacitor, respectively, two sources of the fourth switching transistor and the third switching transistor are electrically connected to the low voltage, two sources of the fifth switching transistor and the sixth switching transistors receive the system voltage, two drains of the fifth switching transistor and the sixth switching transistor are electrically connected to the first terminal and the second terminal of the charge storage capacitor, respectively.

14. The circuit system according to claim 13, wherein in the first reset state, the third switching transistor and the fifth switching transistor are turned on, and the first, second, fourth and sixth switching transistors are turned off;

wherein in the first comparison state, the second switching transistor and the fourth switching transistor are turned on, and the first, third, fifth and sixth switching transistors are turned off;

wherein in the second reset state, the fourth switching transistor and the sixth switching transistor are turned on, and the first, second, third and fifth switching transistors are turned off;

wherein in the second comparison state, the first switching transistor and the third switching transistor are turned on, and the second, fourth, fifth and sixth switching transistors are turned off.

15. The circuit system according to claim 13, wherein the control unit comprises a first AND gate, a second AND gate, a first NAND gate and a second NAND gate, the first AND gate is configured to receive the first clock signal and the second clock signal and generate the second switching control signal, the second AND gate is configured to receive the first clock signal and the second inverse clock signal and generate the first switching control signal, the first NAND gate is configured to receive the first inverse clock signal and the second clock signal and generate the fourth switching control signal, and the second NAND gate is configured to receive the first inverse clock signal and the second inverse clock signal and generate the third switching control signal.

16. The circuit system according to claim 10, wherein the differential amplifier stage comprises a first transistor and a second transistor, wherein two gates of the first transistor and the second transistor receive the first input signal and the second input signal, respectively, two sources of the first transistor and the second transistor are electrically connected to the third node, and two drains of the first transistor and the second transistor are electrically connected to the second node and the first node, respectively.

17. The circuit system according to claim 10, wherein the switching unit comprises a third transistor, a fourth transistor, a first capacitor and a second capacitor, wherein two ends of the first capacitor are electrically connected to the second node and the low voltage, respectively, two ends of the second capacitor are electrically connected to the first node and the low voltage, respectively, two gates of the third transistor and the fourth transistor receive the first clock signal, two sources of the third transistor and the fourth transistor are electrically receive the system voltage, and two drains of the third transistor and the fourth transistor are electrically connected to the second node and the first node, respectively.

\* \* \* \* \*